US006485994B1

(12) United States Patent
Ohno

(10) Patent No.: US 6,485,994 B1
(45) Date of Patent: Nov. 26, 2002

(54) METHOD OF ARRAYING SELF-SCANNING LIGHT-EMITTING ELEMENT ARRAY CHIPS

(75) Inventor: Seiji Ohno, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 27 days.

(21) Appl. No.: 09/856,084

(22) PCT Filed: Sep. 18, 2000

(86) PCT No.: PCT/JP00/06345

§ 371 (c)(1),
(2), (4) Date: May 17, 2001

(87) PCT Pub. No.: WO01/21410

PCT Pub. Date: Mar. 29, 2001

(30) Foreign Application Priority Data

Sep. 21, 1999 (JP) .......................................... 11-266872

(51) Int. Cl.$^{7}$ ............................................... H01L 21/00

(52) U.S. Cl. ............................ 438/22; 438/29; 438/69; 438/73; 438/975

(58) Field of Search ............................ 438/22, 29, 69, 438/73, 975

(56) References Cited

U.S. PATENT DOCUMENTS 4,707,615 A * 11/1987 Hosaka ....................... 250/578
4,857,801 A * 8/1989 Farrell ........................ 313/500
5,519,430 A * 5/1996 De Cock et al. ............ 347/238
5,997,152 A * 12/1999 Taninaka et al. ............ 362/249
6,211,537 B1 * 3/2001 Shimizu et al. ............... 257/88

FOREIGN PATENT DOCUMENTS

JP 8-216448 8/1996
JP 9-99583 4/1997
JP 9-283808 10/1997
JP 9-289807 10/1997
JP 2000-168126 6/2000

OTHER PUBLICATIONS

PCT International Search Report, Dec. 6, 2000.

* cited by examiner

*Primary Examiner*—Richard Elms
*Assistant Examiner*—Michael K. Luhrs
(74) *Attorney, Agent, or Firm*—RatnerPrestia

(57) ABSTRACT

A method of arraying self-scanning light-emitting element array chips is provided, in which it is possible to remove defective chips completely. A plurality of self-scanning light-emitting array chips in a zigzag manner on a substrate, each chip being rectangular and comprising an array of light-emitting elements arrayed in a line facing to one end of the chip and a plurality of bonding pads provided on the other end of the chip. The plurality of chips are arrayed in such a manner that one ends of neighboring chips are arranged without overlapping in an array direction of chips so that an array pitch of chips is constant, and the other ends of the chips are arranged with overlapping in a direction perpendicular to an array direction of chips so that an array pitch of chips is constant.

6 Claims, 4 Drawing Sheets

METHOD OF ARRAYING SELF-SCANNING LIGHT-EMITTING ELEMENT ARRAY CHIPS

TECHNICAL FIELD

The present invention relates to a method of arraying self-scanning light-emitting element array chips, in which it is possible to remove defective chips. The present invention further relates to a self-scanning light-emitting device comprising a plurality of chips arrayed by said method, and a method of removing defective chips from arrayed chips.

BACKGROUND ART

A self-scanning light-emitting element array chip has a characteristic such that the number of bonding pads is more less than that of a conventional light-emitting element array chip. Due to this characteristic, the size of a chip may be effectively small. For example, if bonding pads are provided at both ends of a rectangular chip, the width of the chip may be short to that required only by bonding pads themselves. However, when a plurality of self-scanning light-emitting element chips are arrayed in a straight line manner to form a self-scanning light-emitting device used for an optical printer head, an array pitch of light-emitting elements can not be constant at the ends of the neighboring chips. In order to avoid this, a plurality of chips are arrayed in a zigzag manner such that the ends thereof are overlapped (see Japanese Patent Publication No. 8-216448).

FIG. 1 shows a schematic drawing for explaining a method of arraying chips in a zigzag manner. For assistance of explanation, an x-y coordinate axis is designated in the figure. An x-axis direction shows an array direction of chips and a y-axis direction perpendicular thereto.

At the both ends of a self-scanning light-emitting element array chip 10, there are provided bonding pads 12 between thereof a plurality of light-emitting elements 14 are arrayed in a straight line manner. A plurality of self-scanning light-emitting element array chips 10 are arrayed and fixed by means of an adhesive on a substrate (not shown in the figure) in a zigzag manner in an x-axis direction, i.e. in such a manner that the ends of neighboring chips are overlapped in a y-axix direction. According to this method, an array pitch of the light-emitting elements may be constant through all of the chips.

A few chips may be defective by any reason after a die bonding process and wire bonding process to the chips arrayed on the substrate. In this case, it is not effective in cost to discard the substrate itself thereon the defective chips are mounted. Therefore, the method is adopted such that only defective chips are removed and replaced by normal chip. In fact, the defective chip is removed in such a manner that a metallic tool is push against the side of the chip. In the conventional chip array in a zigzag manner, neighboring chips are overlapped at their ends in a y-axis direction. In order to remove one chips in the conventional chip array, that one chip only must be push by means of a narrow metallic tool 16 as shown in FIG. 1. A light-emitting element array chip is generally made of fragile compound semiconductor such as GaAs. Therefore, when a force is applied to a part of the defective chip fixed on the substrate by an adhesive, the chip is generally crushed leaving a portion of the chip overlapped in a y-axis direction on the substrate. It is quite difficult to remove the left portion without damaging the neighboring chips.

DISCLOSURE OF THE INVENTION

An object of the present invention is to provide a method of arraying self-scanning light-emitting element array chips, in which it is possible to remove defective chips completely.

Another object of the present invention is to provide a self-scanning light-emitting device comprising a plurality of self-scanning light-emitting element array chips arrayed by said method.

A further object of the present invention is to provide a method of removing defective chips.

A first aspect of the present invention is a method of arraying a plurality of self-scanning light-emitting array chips in a zigzag manner on a substrate, each chip being rectangular and comprising an array of light-emitting elements arrayed in a line facing to one end of the chip and a plurality of bonding pads provided on the other end of the chip. In this method, the plurality of chips are arrayed in such a manner that one ends of neighboring chips are arranged without overlapping in an array direction of chips so that an array pitch of chips is constant, and the other ends of the chips are arranged with overlapping in a direction perpendicular to an array direction of chips so that an array pitch of chips is constant.

Each self-scanning light-emitting element array chip comprises an array of transfer elements having such a structure that a plurality of three-terminal transfer elements each having a control electrode for controlling threshold voltage or current are arranged, the control electrodes of the transfer elements neighbored to each other are connected via first electrical means, a power supply line is connected to the control electrodes via second electrical means, and a clock line is connected to one of two terminals except the control electrode of each of the transfer elements; and the array of light-emitting elements having such a structure that a plurality of three-terminal light-emitting elements each having a control electrode for controlling threshold voltage or current are arranged.

A second aspect of the present invention is a self-scanning light-emitting device comprising a plurality of self-scanning light-emitting array chips which are arranged by the method of arraying the plurality of self-scanning light-emitting array chips in a zigzag manner on a substrate.

A third aspect of the present invention is a method of removing a defective chip in a plurality of self-scanning light-emitting array chips arrayed on a substrate by the method of arraying the plurality of self-scanning light-emitting array chips in a zigzag manner on a substrate. In this method, the defective chip is removed together with a chip overlapped with the defective chip in a direction perpendicular to an array direction of chips by applying force to one side of the defective chip or the chip overlapped therewith in a direction perpendicular to an array direction of chips.

BEST MODE FOR CARRYING OUT THE INVENTION

Figure 2:
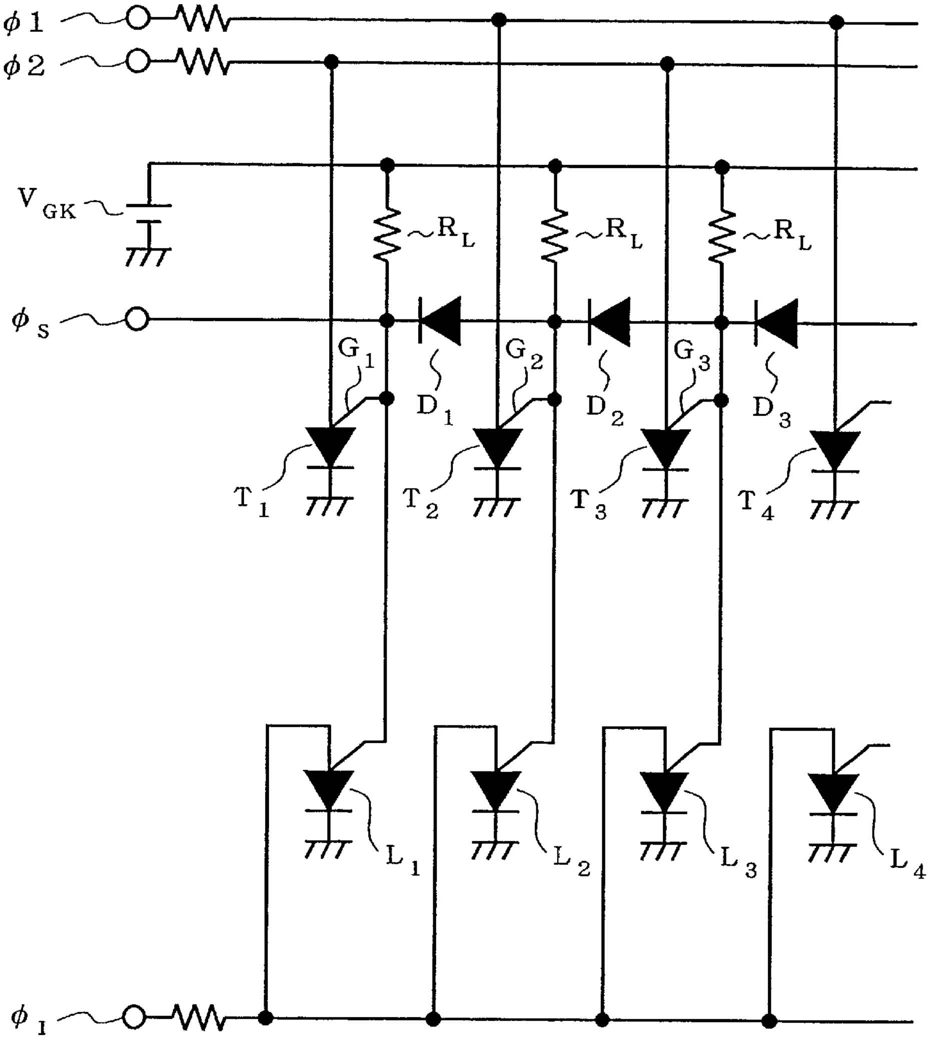
FIG. 2 is an equivalent circuit diagram of a self-scanning light-emitting element array.

Referring to FIG. 2, there is shown an equivalent circuit diagram of a self-scanning light-emitting element array relating to the present invention. This self-scanning light-emitting element array has a structure such that the portion of an array of transfer elements and the portion of an array of light-emitting elements are separated. The portion of an array of transfer elements includes transfer elements $T_1$, $T_2$, $T_3$, . . . and the portion of an array of light-emitting elements includes writable light-emitting elements $L_1$, $L_2$, $L_3$, . . . These transfer elements and wirtable light-emitting elements consist of three-terminal light-emitting thyristors, respectively. The structure of the portion of an array of transfer elements further includes diode $D_1$, $D_2$, $D_3$, . . . as means for electrically connecting the gate electrodes of the neighboring transfer elements to each other. $V_{GK}$ is a power supply (normally 5 volts), and is connected to all of the gate electrodes $G_1$, $G_2$, $G_3$, . . . of the transfer elements via a load resistor $R_L$, respectively. Respective gate electrodes $G_1$, $G_2$, $G_3$, . . . are correspondingly connected to the gate electrodes of the writable light-emitting elements $L_1$, $L_2$, $L_3$, . . . A start pulse $\phi_s$ is applied to the gate electrode of the transfer element $T_1$, transfer clock pulses φ1 and φ2 are alternately applied to all of the anode electrodes of the transfer elements, and a write signal $\phi_I$ is applied to all of the anode electrodes of the light-emitting elements.

The operation of this self-scanning light-emitting array will now be described briefly. Assume that as the transfer clock pulse φ1 is driven to H (high level), the transfer element $T_2$ is turned on. At this time, the voltage of the gate electrode $G_2$ is dropped to a level near zero volts from 5 volts. The effect of this voltage drop is transferred to the gate electrode $G_3$ via the diode $D_2$ to cause the voltage of the gate electrode $G_3$ to set about 1 volt which is a forward rise voltage (equal to the diffusion potential) of the diode $D_2$. On the other hand, the diode $D_1$ is reverse-biased so that the potential is not conducted to the gate $G_1$, then the potential of the gate electrode $G_1$ remaining at 5 volts. The turn on voltage of the light-emitting thyristor is approximated to a gate electrode potential+a diffusion potential of PN junction (about 1 volt.) Therefore, if a high level of a next transfer clock pulse φ2 is set to the voltage larger than about 2 volts (which is required to turn-on the transfer element $T_3$) and smaller than about 4 volts (which is required to turn on the transfer element $T_5$), then only the transfer element $T_3$ is turned on and other transfer elements remain off-state, respectively. As a result of which, on-state is transferred from $T_2$ to $T_3$. In this manner, on-state of transfer element are sequentially transferred by means of two-phase clock pulses.

The start pulse $\phi_s$ works for starting the transfer operation described above. When the start pulse $\phi_s$ is driven to a low level (about 0 volt) and the transfer clock pulse φ2 is driven to a high level (about 2–4 volts) at the same time, the transfer element $T_1$ is turned on. Just after that, the start pulse $\phi_s$ is returned to a high level. Assuming that the transfer element $T_2$ is in the on-state, the voltage of the gate electrode $G_2$ is lowered to almost zero volt. Consequently, if the voltage of the write signal $\phi_I$ is higher than the diffusion potential (about 1 volt) of the PN junction, the light-emitting element $L_2$ may be turned into an on-state (a light-emitting state).

On the other hand, the voltage of the gate electrode $G_1$ is about 5 volts, and the voltage of the gate electrode $G_3$ is about 1 volt. Consequently, the write voltage of the light-emitting element $L_1$ is about 6 volts, and the write voltage of the light-emitting element $L_3$ is about 2 volts. It is appreciated from this that the voltage of the write signal $\phi_I$ which can write into only the light-emitting element $L_2$ is in the range of about 1–2 volts. When the light-emitting element $L_2$ is turned on, that is, in the light-emitting state, the amount of the light thereof is determined by the amount of current of the write signal $\phi_I$. Accordingly, the light-emitting elements may emit the light at any desired amount of light. In order to transfer on-state to the next element, it is necessary to first turn off the element in on-state by temporarily dropping the voltage of the write signal $\phi_I$ down to zero volts.

A self -scanning light-emitting device according to the present invention is fabricated by arraying a plurality of self-scanning light-emitting array chips each thereof comprises 600 dpi (dot per inch)/128 light-emitting points, for example, and has a rectangular shape of about 5.4 mm length.

Figure 3:
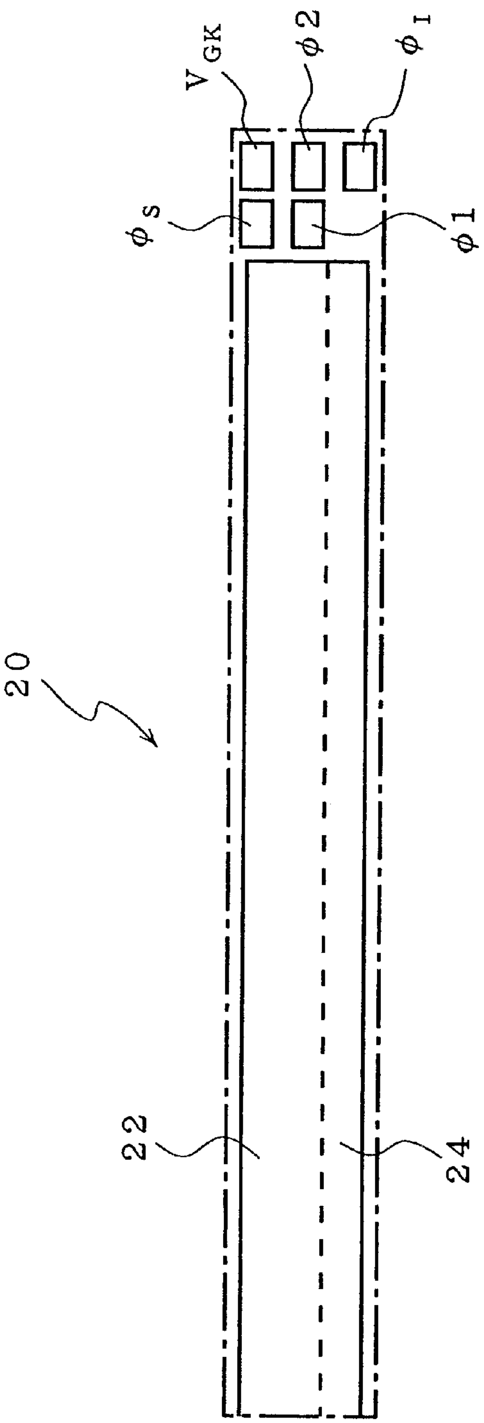
FIG. 3 shows an arrangement of bonding pads in a self-scanning light-emitting array chip.

Referring to FIG. 3, there is shown an arrangement of bonding pads in a self-scanning light-emitting array chip 20. In the figure, φ1, φ2, $\phi_s$, $\phi_I$ and $V_{GK}$ designate the bonding pads for clock pulses, a start pulse, a write signal, and a power supply, respectively. All of these bonding pads are arranged collectively at one side of the chip 20. The portion 22 of an array of transfer elements and the portion 24 of an array of light-emitting elements are arranged so as to face to one end of the chip 20 opposite to said one side.

Figure 4:
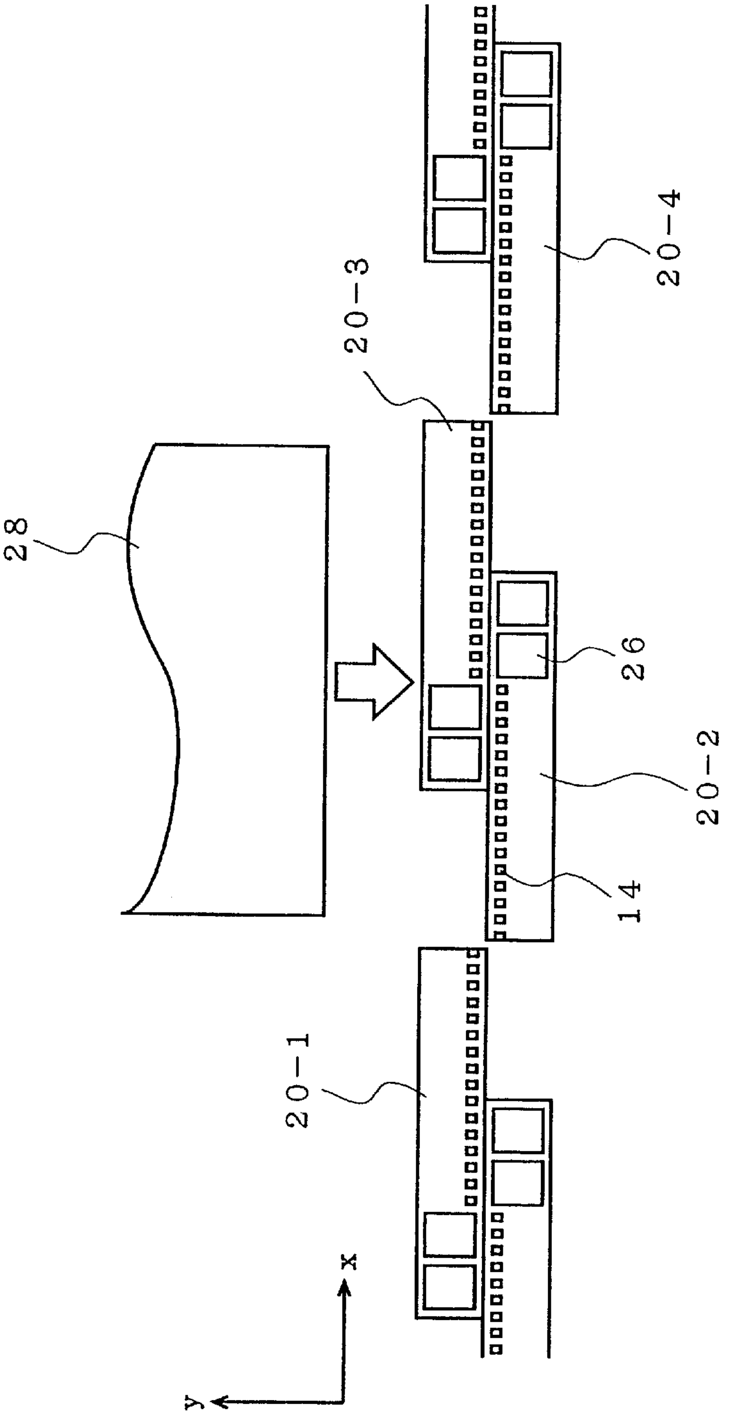
FIG. 4 shows the arrangement of chips.

The arrangement of such chips is shown in FIG. 4. In the figure, only the light-emitting elements 14 and the bonding pads 26 designated in a schematic and enlarged manner are shown for simplifying the drawing.

Figure 1:
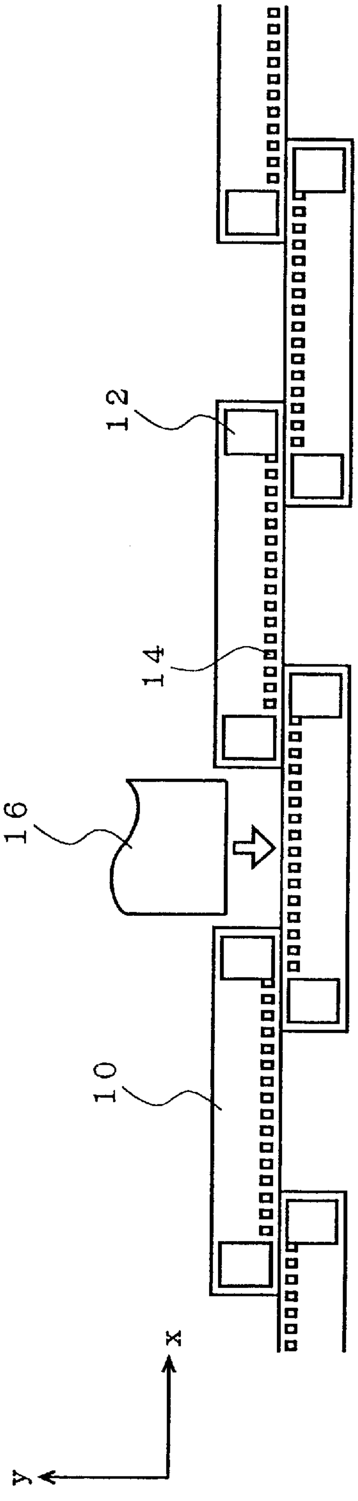
FIG. 1 is a schematic drawing for explaining a method of arraying chips in a zigzag manner.

The chips 20-1, 20-2, 20-3, . . . are arrayed on a substrate (not shown) in a zigzag manner like in FIG. 1. According to the present invention, the one ends (each thereto an array of light-emitting elements 14 is faced) of the neighboring chips are arranged oppositely to each other so that an array pitch of light-emitting elements 14 is constant (for example, as the chips 20-1 and 20-2 in FIG. 4), and the other ends (each thereon the bonding pads are provided) are arranged overlapping in a y-axis direction to each other so that an array pitch of light-emitting elements 14 is constant (for example, as the chips 20-2 and 20-3 in FIG. 4).

In the same way as described above, the chips are mounted on the substrate by arraying them in a zigzag manner to fabricate a self-scanning light-emitting device.

Assume that the chip 20-2 is a defective one within the chips arrayed on the substrate, and the chip 20-3 is overlapped with the chip 20-2. In order to remove the defective chip 20-2, a metallic tool 28 is pushed against the side of the chip 20-3 to apply the force to the chip 20-3 to remove the two chips together, as shown in FIG. 4. The chips 20-2 and 20-3 are not overlapped with the chips 20-1 and 20-4 in a y-axis direction. Therefore, it is possible to remove only two chips, because the force is not applied to the neighboring chips 20-1 and 20-4.

INDUSTRIAL APPLICABILITY

According to the method of the present invention described above, a defective chip may be removed from the self-scanning light-emitting element array chips without damaging the chips neighbored to the defective chip. Therefore, the cost reduction in fabricating the self-scanning light-emitting device may be effective.

What is claimed is:

1. A method of arraying a plurality of self-scanning light-emitting array chips in a zigzag manner on a substrate, each chip being rectangular and comprising an array of light-emitting elements arrayed in a line facing to one end of the chip and a plurality of bonding pads provided on the other end of the chip, characterized in that;

the plurality of chips are arrayed in such a manner that one ends of neighboring chips are arranged without overlapping in a direction perpendicular to an array direction of chips so that an array pitch of chips is constant, and the other ends of the chips are arranged with overlapping in a direction perpendicular to an array direction of chips so that an array pitch of chips is constant.

2. The method of claim 1, wherein each of the plurality of self-scanning light-emitting element array chips comprises;

an array of transfer elements having such a structure that a plurality of three-terminal transfer elements each having a control electrode for controlling threshold voltage or current are arranged, the control electrodes of the transfer elements neighbored to each other are connected via first electrical means, a power supply line is connected to the control electrodes via second electrical means, and a clock line is connected to one of two terminals except the control electrode of each of the transfer elements, and the array of light-emitting elements having such a structure that a plurality of three-terminal light-emitting elements each having a control electrode for controlling threshold voltage or current are arranged.

3. A self-scanning light-emitting device comprising a plurality of self-scanning light-emitting array chips which are arranged by the method of claim 1 or 2.

4. A method of removing a defective chip in a plurality of self-scanning light-emitting array chips arrayed on a substrate by the method of claim 1 or 2, characterized in that;

the defective chip is removed together with a chip overlapped with the defective chip in a direction perpendicular to an array direction of chips.

5. The method of claim 4, wherein the defective chip and the chip overlapped therewith are removed together by applying force to one side of the defective chip or the chip overlapped therewith in a direction perpendicular to an array direction of chips.

6. The method of claim 5, wherein the force is applied by pushing a metallic tool against the one side of the defective chip or the chip overlapped therewith.

* * * * *

UNITED STATES PATENT AND TRADEMARK OFFICE

CERTIFICATE OF CORRECTION

PATENT NO. : 6,485,994 B1 Page 1 of 1
DATED : November 26, 2002
INVENTOR(S) : Seiji Ohno It is certified that error appears in the above-identified patent and that said Letters Patent is hereby corrected as shown below:

<u>Column 3,</u>
Line 6, delete "wirtable" and insert -- writable --.

Signed and Sealed this

Seventeenth Day of August, 2004

JON W. DUDAS
*Acting Director of the United States Patent and Trademark Office*